(12) United States Patent
Satoh

(10) Patent No.: US 6,501,690 B2
(45) Date of Patent: Dec. 31, 2002

(54) SEMICONDUCTOR MEMORY DEVICE CAPABLE OF CONCURRENTLY DIAGNOSING A PLURALITY OF MEMORY BANKS AND METHOD THEREOF

(75) Inventor: Masaru Satoh, Tokyo (JP)

(73) Assignee: NEC Corporation, Tokyo (JP)

( * ) Notice: Subject to any disclaimer, the term of this patent is extended or adjusted under 35 U.S.C. 154(b) by 55 days.

(21) Appl. No.: 09/730,787

(22) Filed: Dec. 7, 2000

(65) Prior Publication Data

US 2001/0000449 A1 Apr. 26, 2001

(30) Foreign Application Priority Data

Dec. 8, 1999 (JP) .......................................... 11-348744

(51) Int. Cl.[7] .............................................. G11C 29/00
(52) U.S. Cl. .................. 365/201; 365/220; 365/230.03; 365/189.07; 365/189.05; 365/195; 365/189.08; 714/719; 714/718
(58) Field of Search ............................ 365/201, 230.03, 365/220, 189.07, 189.05, 195, 191, 189.08; 714/719, 718

(56) References Cited

U.S. PATENT DOCUMENTS

| | | | | |
|---|---|---|---|---|
| 6,088,823 A | * | 7/2000 | Ayres et al. | ................. 714/733 |
| 6,247,153 B1 | * | 6/2001 | Jeon et al. | ................... 714/718 |
| 6,263,461 B1 | * | 7/2001 | Ayres et al. | ................. 714/718 |

FOREIGN PATENT DOCUMENTS

| | | | | |
|---|---|---|---|---|
| JP | 60-115099 | 6/1985 | ............ | G11C/29/00 |
| JP | 63-201858 | 8/1988 | ............ | G06F/12/16 |
| JP | 2-17555 | 1/1990 | ............ | G06F/12/16 |
| JP | 4-251355 | 9/1992 | ............ | G06F/12/16 |

* cited by examiner

Primary Examiner—Andrew Q. Tran
(74) Attorney, Agent, or Firm—McGinn & Gibb, PLLC

(57) ABSTRACT

A memory diagnostic circuit includes: a diagnostic circuit which sets a plurality of memory banks to an access/enable state at one time, writes predetermined common data into the memory banks, and parallelly reads out storage data of the plurality of memory banks; a comparison circuit which compares the data read out from the plurality of memory banks with the data written into the memory banks; and a discrimination circuit which discriminates whether or not there is any defect in the plurality of memory banks based on a comparison result.

11 Claims, 3 Drawing Sheets

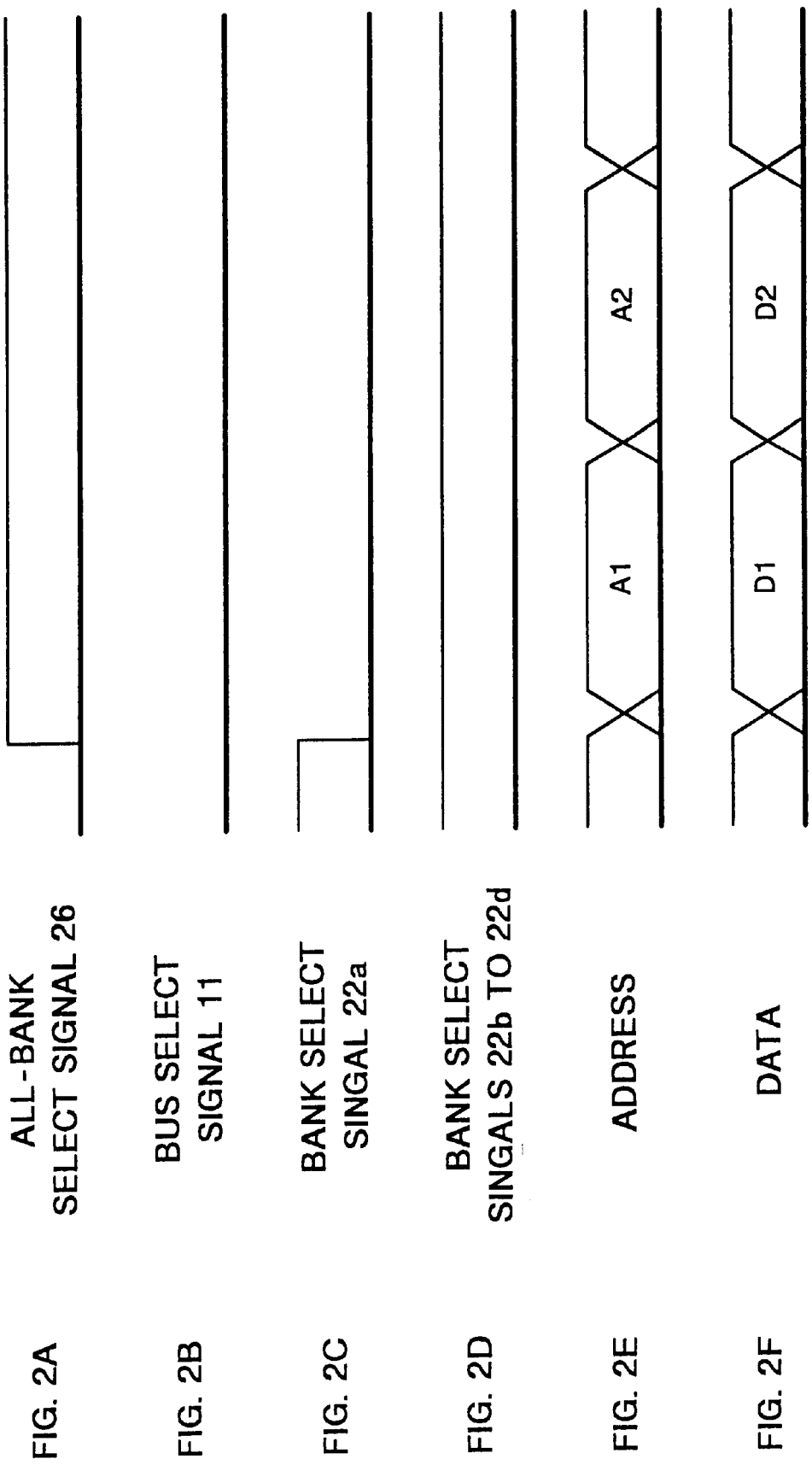

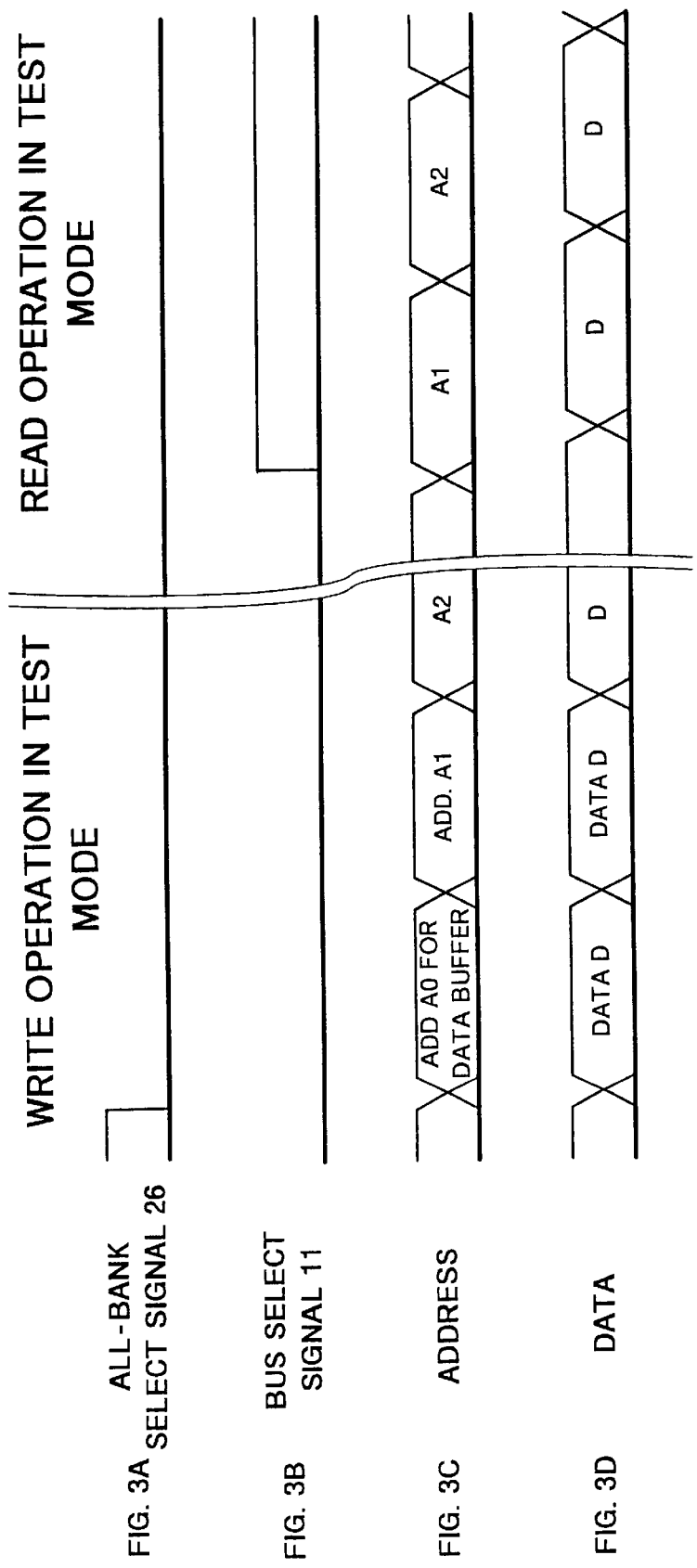

SEMICONDUCTOR MEMORY DEVICE CAPABLE OF CONCURRENTLY DIAGNOSING A PLURALITY OF MEMORY BANKS AND METHOD THEREOF

BACKGROUND OF THE INVENTION

1. Field of the Invention

The present invention relates to a semiconductor memory device having a memory array including a plurality of memory banks, and, more particularly, to a memory diagnostic circuit and a method for diagnosing a plurality of memory banks.

2. Description of the Related Art

In a semiconductor memory device, such as a DRAM or the like, a memory array is divided into a plurality of banks which can independently be operated.

In such a semiconductor memory device, it is necessary to diagnose whether a defect exists in each memory bank, after the complete manufacture of the semiconductor memory device and before shipping of the device. Hence, a circuit for diagnosing the memory is included inside the semiconductor memory device or externally connected thereto.

In conventional memory diagnostic circuits, the diagnosis of any defect in each memory array of the semiconductor memory device is performed in the unit of memory banks. Therefore, in the conventional memory diagnostic circuits, the more the number of banks, the longer the time for diagnosing the memory device.

SUMMARY OF THE INVENTION

It is accordingly an object of the present invention to provide a memory diagnostic circuit which can complete diagnosing a memory array including a plurality of memory banks in a memory device within a short period of time even if the number of memory banks increases.

In order to accomplish the above object, according to the first aspect of the present invention, there is provided a method for diagnosing a memory array including a plurality of memory banks which can independently read/write data, said method comprising:

parallelly writing identical data into the plurality of memory banks, when diagnosing the memory array;

reading out storage data from the plurality of memory banks; and comparing the data read out from the plurality of memory banks and the written data, determining that the memory banks are in a normal state when the read data and the written data coincide with each other, and determining that a defect exists in either one of the memory banks when the read data and the written data do not coincide with each other.

According to the above method, the memory including the plurality of banks can be diagnosed at one time. Hence, there is no need to diagnose the memory for each bank. This results in that the diagnosing can be completed within a short period of time, regardless of the number of the banks.

In order to achieve the above object, according to the second aspect of the present invention, there is provided a memory diagnostic circuit for diagnosing a memory array divided into a plurality of memory banks which can independently read/write data, said circuit comprising:

a diagnostic controlling section which writes predetermined common data into the plurality of memory banks, and parallely reads out storage data from the plurality of memory banks;

a memory which stores the predetermined common data written into the plurality of memory banks; and a comparison circuit which compares the data read out from the plurality of memory banks with the write-data stored in said memory, and outputs a comparison result.

In the memory diagnostic circuit of this invention, when to diagnose the memory array divided into the plurality of memory banks, the diagnostic controller controls the memory banks to collectively write data at one time, and the comparison circuit compares the written data and the data from the memory banks. In this structure, the plurality of memory banks can be diagnosed at one time. Hence, the diagnosing the plurality of memory banks can be achieved within a short period of time, regardless of the number of the memory banks.

BRIEF DESCRIPTION OF THE DRAWINGS

The object and other objects and advantages of the present invention will become more apparent upon reading of the following detailed description and the accompanying drawings in which:

FIGS. 2A to 2F are timing charts for explaining normal operations of the memory device of FIG. 1;

FIGS. 3A to 3D are timing charts for explaining test operations of the memory device of FIG. 1.

DETAILED DESCRIPTION OF THE PREFERRED EMBODIMENT

Figure 1:
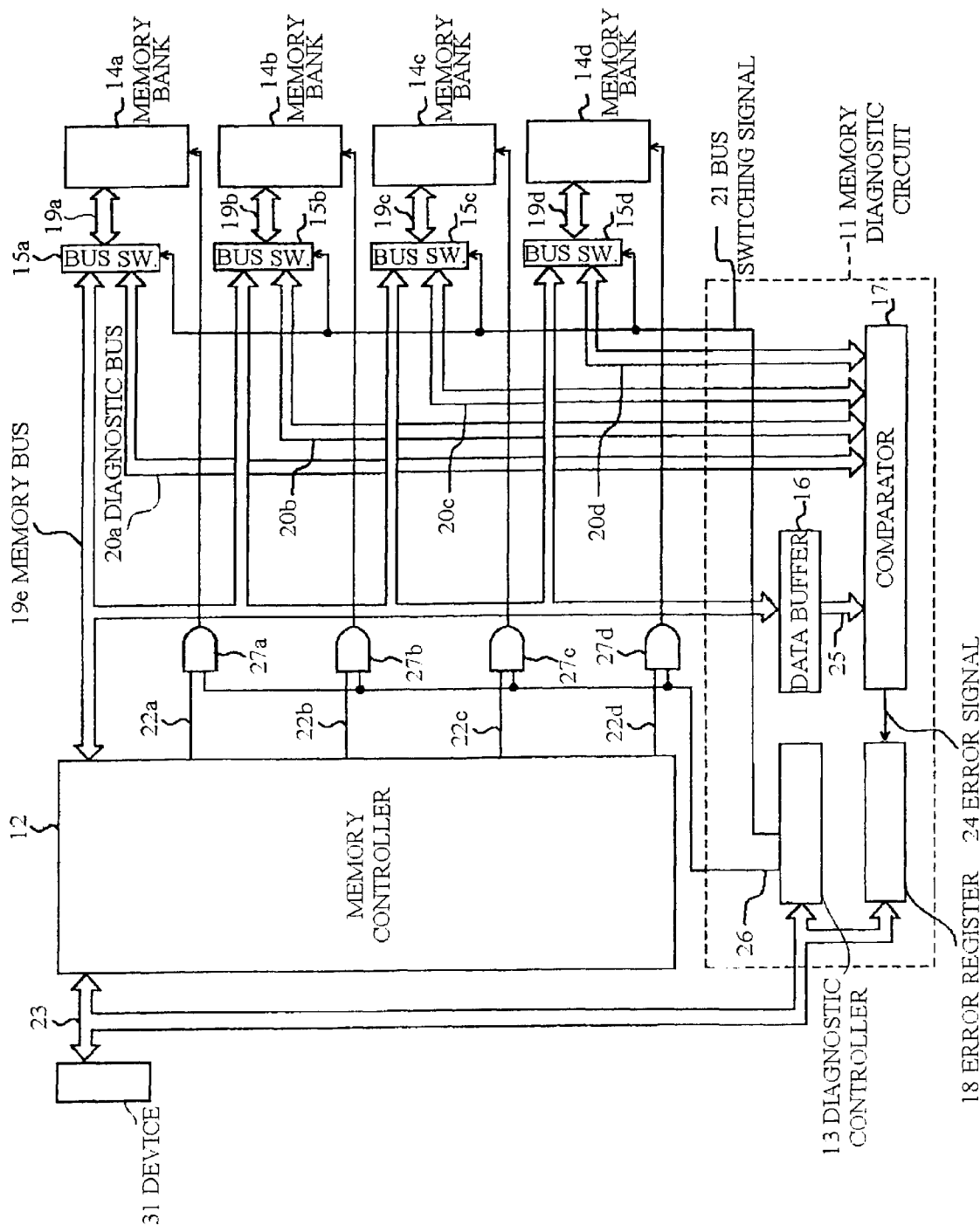
FIG. 1 is a block diagram showing the structure of a memory device having a memory diagnostic circuit according to one embodiment of the present invention.

The structure of a semiconductor memory device according to one embodiment of the present invention will now be explained with reference to the accompanying drawings.

FIG. 1 shows the structure of the semiconductor memory device having a memory diagnostic circuit 11 of this embodiment.

This semiconductor memory device comprises the memory diagnostic circuit 11, a memory controller 12, four memories (memory banks) 14a to 14d, bus switching sections 15a to 15d, and AND gates 27a to 27d.

The memory controller 12 is connected to a device 31, such as a CPU (Central Processing Unit), etc., for accessing the memory banks 14a to 14d, via a local bus 23. To activate a memory bank having a memory area which is designated by the device 31, the memory controller 12 sets bank-select signals 22a to 22d to an active level (low level), and accesses one memory bank which is in an active state through memory buses 19a to 19d and 19e.

When a bus switching signal 21 is at a low level, the bus switching sections 15a to 15d connect the memory bus 19e with their corresponding one of memory buses 19a to 19d. On the contrary, when the bus switching signal 21 is at a high level, the bus switching sections 15a to 15d connect the memory buses 19a to 19d with their corresponding one of diagnostic buses 20a to 20d, respectively.

Each of the AND gates 27a to 27d performs a logical AND operation on its corresponding one of the bank-select signals 22a to 22d and an ALL-bank-select signal 26, and outputs a result of the operation. The output from each of the AND gates 27a to 27d is at a low level, when its corresponding one of the bank-select signals 22a to 22d or the ALL-bank-select signal 26 is at a low level (active level).

Each of the memory banks 14a to 14d inputs the output of its corresponding one of AND gates 27a to 27d. When the output from each of the AND gates 27a to 27d is at an active level (low level), its corresponding one of the memory banks 14a to 14d is activated so as to be accessible.

The memory diagnostic circuit 11 is connected to the device 31 via the local bus 23, and comprises a diagnostic controller 13, a data buffer 16, an error register 18, and a comparator 17.

The diagnostic controller 13 sets the bus switching signal 21 to an active level (low level) during a normal operation, and sets the ALL-bank-select signal 26 to an inactive level (high level). The diagnostic controller 13: (1) sets the ALL-bank-select signal 26 to an active level (low level), upon reception of an instruction for an operation for diagnosing the memory banks from the device 31 through the local bus 23; (2) sets the bus switching signal 21 to an active level (low level) and controls the bus switching sections 15a to 15d to connect the memory bus 19e with their corresponding one of the memory buses 19a to 19d, upon reception of a WRITE instruction from the device 31; and (3) sets the bus switching signal 21 to a high level and controls the bus switching sections 15a to 15d to connect their corresponding one of the memory buses 19a to 19d with the respective diagnostic buses 20a to 20d, upon reception of a READ instruction from the device via the local bus 23. After the operation for diagnosing memory banks, if the diagnostic controller 13 ascertains that error information is stored in the error register 18, it informs the device 31 that a defect exists somewhere in the memory banks 14a to 14d via the local bus 23. On the contrary, if no error information is stored in the error register 18, the diagnostic controller 13 informs the device 31 of the fact that the memory banks 14a to 14d are in a normal state via the local bus 23.

During the operation for diagnosing the memory banks, the data buffer 16 temporarily holds write-data sent through the memory bus 19e. This write-data is an expected value in a comparison process carried out by the comparator 17. The error register 18 stores an error signal 24 sent from the comparator 17.

The comparator 17: (1) compares data, read out from each of the memory banks 14a to 14d during the operation for diagnosing the memory banks, with the write-data temporarily stored in the data buffer 16; and (2) outputs the error signal 24 to the error register 18, when the data from the memory banks 14a to 14d does not coincide with the write-data of the data buffer 16. The error register 18 stores the error signal 24.

The circuit, which includes: the memory diagnostic circuit 11; the controller 12; the memory banks 14a to 14d; the bus switching sections 15a to 15d; and the AND gates 27a to 27d, may be integrated into one chip. In this case, a memory chip including a diagnostic circuit can be obtained. On the other hands, only the memories (memory banks) 14a to 14d may be integrated into one chip. In this case, a peripheral circuit, which includes: the memory diagnostic circuit 11; the controller 12; the bus switching sections 15a to 15d; and the AND gates 27a to 27d, is connected to the memory banks 14a to 14d. Further, the circuit, which includes: the controller 12; memory banks 14a to 14d; the bus switching sections 15a to 15d; and the AND gates 27a to 27d, may be integrated into one memory chip. In this case, the memory diagnostic circuit 11 is externally connected to this memory chip.

Operations of the memory diagnostic circuit of this embodiment will now be explained.

Normal Operation

Explanations will now be made to an operation of the device 31 accessing any one of the memory banks 14a to 14d during a normal operation, with reference to timing charts of FIGS. 2A to 2F. For easy understanding, it is assumed that the device 31 is to access the memory bank 14a.

In a normal operation mode, the diagnostic controller 13 sets, as shown in FIGS. 2A and 2B, the bus switching signal 21 to an active level (low level) and the ALL-bank-select signal 26 to an inactive level (high level). In response to the bus switching signal 21 of an active level, the bus switching section 15a connects the memory bus 19a with the memory bus 19e. Since the ALL-bank-select signal 26 is at a high level, the AND gates 27a to 27d have their gates opened.

After the memory controller 12 receives a request for accessing the memory bank 14a from the device 31 via the local bus 23, it sets the bank-select signal 22a to an active level (low level), as shown in FIG. 2C, and sets the bank-select signals 22b to 22d to an inactive level (high level), as shown in FIG. 2D.

Hence, the output from the AND gate 27a is set to an active level (low level), and the outputs from the respective AND gates 27b to 27d are set to an inactive level (high level). Then, the memory bank 14a is in an enable state so as to be accessible, whereas the memory banks 14d to 14d are in a disable state so as to be non-accessible.

Further, as shown in FIG. 2E, the memory controller 12 outputs an address of a target memory area to be accessed in the memory bank 14a via the memory bus 19e and the memory bus 19a. During a write process, the memory controller 12 supplies the memory bank 14a with write-data via the memory bus 19e and the memory bus 19a, as shown in FIG. 2F. The memory bank 14a is in an enable state due to the bank-select signal 22a. The memory bank 14a writes the supplied data in a location specified by a supplied address. On one hand, when a read-access is issued, the memory bank 14a reads out data stored in the location specified by the supplied address, and outputs the read data as shown in FIG. 2F.

The same normal operation is carried out for the rest of the memory banks 14b to 14d.

Operation for Diagnosing Memory

Operations for diagnosing the memory banks will now be explained with reference to FIGS. 3A to 3D. Let it be assumed that an instruction for diagnosing the memory banks is issued from the device 31 connected to the local bus 23.

As illustrated in FIG. 3A, a diagnostic operation includes a write process and a read/comparison process which are carried out in a sequential order.

The device 31 issues an instruction for diagnosing the memory banks to the diagnostic controller 13 included in the memory diagnostic circuit 11 through the local bus 23. In response to the instruction, the diagnostic controller 13 sets the ALL-bank-select signal 26 to an active level (low level). The entire outputs from the respective AND gates 27a to 27d are set to an active level (low level) by the ALL-bank-select signal 26 of an active level. Hence, the entire memory banks 14a to 14d are in an active state (accessible state).

The diagnostic controller 13, as illustrated in FIG. 3B, retains the bus switching signal 21 as is at a low level, likewise in the normal operation. Thus, the bus switching sections 15a to 15d continue to connect the memory bus 19e with their corresponding one of the memory buses 19a to 19d.

After this, the device 31 issues a WRITE instruction to the memory diagnostic circuit 11 via the local bus 23. In response to this instruction, the memory controller 12, as shown in FIGS. 3C and 3D, outputs an address of a corresponding memory area in the data buffer 16 and target data D to be written onto the memory bus 19e. The data buffer 16 stores the supplied data D, and supplies the comparator 17 with the data D via the data bus 25. The comparator 17 stores the supplied data D in an internal register.

After this, the memory controller 12 sequentially outputs addresses of memory areas in the memory banks 14a to 14d onto the memory bus 19e while updating the addresses, as shown in FIG. 3C. At the same time, the memory controller 12 continues to output the target data D to be written onto the memory bus 19e. Having performed this, for one write cycle, the same data D is simultaneously written in the memory areas of the respective memory banks 14a to 14d which have the same memory address. While updating the addresses of the memory areas in the memory banks 14a to 14d, the write process is repeated, thereby the same data D is written in the entire memory areas of the memory banks 14a to 14d.

The device 31 issues a READ instruction onto the local bus 23.

In response to this instruction, the diagnostic controller 13 sets the bus switching signal 21 to an inactive level (high level) while retaining the ALL-bank-select signal 26 at an active level (low level), as shown in FIGS. 3A and 3B. In response to the bus switching signal 21 at an inactive level (high level), each corresponding one of the bus switching sections 15a to 15d connects their corresponding one of the diagnostic buses 20a to 20d with the respective memory buses 19a to 19d.

Then, the memory controller 12, as illustrated in FIG. 3C, sequentially updates the addresses of the memory areas in the memory banks 14a to 14d, and reads out data stored therein. Thus, data are read out from memory areas of the memory banks 14a to 14d which have the same address, and are parallelly sent to the comparator 17 via the memory buses 19a to 19d and the diagnostic buses 20a to 20d.

The comparator 17 compares the write-data D stored in the data buffer 16 with the data read out from the memory banks 14a to 14d. When the comparator 17 determines that the data from the memory banks 14a to 14d do not coincide with the data D (i.e., the data written in the memory banks 14a to 14d during the above-described write process) stored in the data buffer 16, it outputs the error signal 24 to the error register 18. The error register 18 stores the supplied error signal 24.

After the entire data stored in the memory banks 14a to 14d are read out and the comparison process is completed, the diagnostic controller 13 determines whether there is any error signal written into the error register 18.

When determined that an error signal is written into error register 18, the diagnostic controller 13 informs the device 31 of the fact that a defect exists in either one of the memory banks 14a to 14d via the local bus 23. When determined that the written data D in the data buffer 16 and the data from the memory banks 14a to 14d coincide with each other, as a result of the comparison process, no error signal 24 is output from the comparator 17. Hence, the diagnostic controller 13 informs the device 31 of the fact that no defect exists in the memory banks 14a to 14d through the local bus 23.

In the memory diagnostic circuit 11 of this embodiment, the plurality of memories 14a to 14d which are divided into four memory banks can collectively be diagnosed at one time. Hence, the diagnosing of the memory can be achieved within a short period of time, regardless of the number of memory banks.

In this embodiment, the explanations have been made to the case where four memory banks are employed. However, the present invention is not limited to this, and can be adapted to any other semiconductor memory device having more than or less than four memory banks.

In this embodiment, the explanations have been made to the semiconductor memory device including the memory diagnostic circuit 11. However, the present invention is not limited to the above structure. The present invention can similarly be employed to any other form of a semiconductor memory device-having the memory diagnostic circuit 11 arranged outside the memory device.

The comparison result of the comparator 17 may be sent to the device 31. For example, the comparator 17 may inform the device 31 of the fact whether reference data D coincides with the data from the memory banks 14a to 14d in association with each corresponding address among the memory banks 14a to 14d.

For example, the comparison result of the data may be represented with "0" (not coincident) or "1" (coincident). Particularly, the comparison result for address $ADD_i$ among the four memory banks may be represented in the form of $ADDi$:("the comparison result of the data D with data from the memory bank 14a", "the comparison result of the data D with data from the memory bank 14b", "the comparison result of the data D with data from the memory bank 14c", and "the comparison result of the data D with data from the memory bank 14d"). For example, in the case of $ADD_1$, the comparison result may be represented as $ADD_1$:(0000), and in the case of $ADD_2$, the result may be represented as $ADD_2$:(0100), etc. Such comparison results and the addresses are sent in association with each other in a memory. The device reads the data in the memory in an appropriate manner. The device 31 analyzes the sent data, thereby to determine which one of the memory banks is defective.

In the above-described embodiment, the data D is written while sequentially updating the addresses of the memory banks 14a to 14d. However, the memory banks 14a to 14d may be in a collective write mode, and the same data D can be written in the entire memory areas without specifying the address of the memory areas.

Instead of writing the same data D in the entire memory areas, various data which may differ from each address of the memory areas may be written in the memory areas. In this case, the same address is written in the memory areas, having the same address among the four memory banks, and various data are written in the memory areas with addresses which differ from each other.

As explained above, according to the embodiment of the present invention, when diagnozing memory banks, there is no need to diagnose each memory bank, and the plurality of memory banks can be diagnosed at one time. Therefore, a reduction in the time for diagnosing the memory banks can be realized, regardless of the number of memory banks.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-348744 filed on Dec. 8, 1999, and including specification, claims, drawings and summary. The disclosure of the above Japanese Patent Application is incorporated herein by reference in its entirety.

What is claimed is:

1. A method for diagnosing a memory array including a plurality of memory banks which can independently read/write data, comprising:

writing identical write-data in the plurality of memory banks, when diagnosing the plurality of memory banks;

storing the write-data;

parallelly reading storage data from the plurality of memory banks; and comparing the storage data read out from the plurality of memory banks with the write-data, discriminating that the plurality of memory banks are in a normal state when the storage data and the write-data coincide with each other, and discriminating that a defect exists in any one of the plurality of memory banks when the storage data and the write-data do not coincide with each other.

2. A memory diagnostic circuit for diagnosing a memory array including a plurality of memory banks which can independently read/write data, said circuit comprising:

a diagnostic controlling section which writes predetermined common data into the plurality of memory banks, and parallelly reads out storage data from the plurality of memory banks;

a memory which stores the predetermined common data written into the plurality of memory banks; and a comparison circuit which compares the data read out from the plurality of memory banks with the write-data stored in said memory, and outputs a comparison result.

3. The memory diagnostic circuit according to claim 2, further comprising a discrimination circuit which discriminates that the plurality of memory banks are in a normal state when an output of said comparison circuit indicates "coincidence", and discriminates that a defect exists in any one of the plurality of memory banks when the output of said comparison circuit indicates "non-coincidence".

4. The memory diagnostic circuit according to claim 2, further comprising a data buffer which temporarily retains the write-data during a memory diagnostic process.

5. The memory diagnostic circuit according to claim 2, further comprising an error information memory for storing error information indicating that a defect exists in any one of the plurality of memory banks, when said comparison circuit discriminates that the defect exists in the any one of the plurality of memory banks.

6. A semiconductor memory device which includes the memory diagnostic circuit of claim 2 inside said semiconductor memory device.

7. A semiconductor memory device to which the memory diagnostic circuit of claim 2 is externally connected.

8. A memory diagnostic circuit for diagnosing a memory array including a plurality of memory banks which can independently read/write data, said circuit comprising:

a diagnostic controlling section which simultaneously sets the plurality of memory banks in an accessible/enable state, writes predetermined common data into the plurality of memory banks, and parallelly reads out storage data from the plurality of memory banks;

a memory which stores the predetermined common data written into the plurality of memory banks; and a comparison circuit which compares the data read out from the plurality of memory banks with write-data stored in said memory, and outputs a comparison result.

9. The memory diagnostic circuit according to claim 8, wherein said diagnostic controller includes:

a controlling circuit which outputs a plurality of select-signals for setting the plurality of memory banks into the enable state, in a normal operational mode;

a circuit which outputs an ALL-select signal for setting an ALL-memory bank into the enable state, in a test mode; and means for performing a logical operation on each of the plurality of select-signals and the ALL-select signal, and wherein any one of the plurality of memory banks is set into the enable state in the normal operational mode, and the plurality of memory banks are simultaneously set into the enable state in the test mode.

10. A semiconductor memory device which includes the memory diagnostic circuit of claim 8 inside said semiconductor memory device.

11. A semiconductor memory device to which the memory diagnostic circuit of claim 3 is externally connected.

* * * * *